United States Patent [19]

McAlear et al.

[11] 4,103,064
[45] Jul. 25, 1978

[54] MICRODEVICE SUBSTRATE AND METHOD FOR MAKING MICROPATTERN DEVICES

[75] Inventors: James H. McAlear, Gaithersburg; John M. Wehrung, Potomac, both of Md.

[73] Assignee: Dios, Inc., Potomac, Md.

[21] Appl. No.: 647,871

[22] Filed: Jan. 9, 1976

[51] Int. Cl.² ............................ B05D 5/00; B32B 9/02
[52] U.S. Cl. .................................... 428/333; 156/659;
428/459; 428/460; 428/463; 428/474; 428/500;
428/522; 428/524; 427/53; 427/54; 427/55;
427/56; 427/88; 427/91; 427/96; 427/99;
427/123; 427/124; 427/259; 427/264; 427/265;
427/270; 427/272; 427/273; 427/282; 427/287;
427/407 R; 427/407 A; 427/414; 96/36.2;
96/35.1; 428/336; 428/458
[58] Field of Search .................. 156/13, 17, 18, 2, 11,
156/659, 661; 96/36.2, 35.1; 428/411, 336, 333,
474, 500, 522, 524, 458, 459, 460, 463; 148/187;
357/8; 427/96, 82, 43, 44, 35, 36, 38, 53, 54, 55,
56, 88, 85, 91, 93, 99, 259, 264, 265, 266, 270,
272, 273, 282, 287, 407 R, 407 A, 414, 123, 124

[56] References Cited
U.S. PATENT DOCUMENTS

| T875,030 | 6/1970 | Abbott et al. | 96/33 |
|---|---|---|---|
| 2,051,603 | 8/1936 | Hruska | 156/656 |
| 3,535,137 | 10/1970 | Haller et al. | 156/13 |
| 3,635,853 | 1/1972 | Wiest | 428/474 |
| 3,746,564 | 7/1973 | Parsons | 428/474 |
| 3,779,806 | 12/1973 | Gipstein et al. | 427/43 |
| 3,883,352 | 5/1975 | Kloczewski et al. | 96/35.1 |
| 3,914,462 | 10/1975 | Morishita et al. | 96/35.1 |

*Primary Examiner*—Cameron K. Weiffenbach
*Attorney, Agent, or Firm*—Roylance, Abrams, Berdo & Farley

[57] ABSTRACT

Articles exhibiting a micropattern carried by a surface of a support, typically microdevices comprising a micropattern of a functional material on or in a substrate of a dissimilar material, are produced by a method employing a microsubstrate comprising a substrate base, a protein layer which comprises at least a compressed monolayer of a denatured non-fibrous protein on the base, and a masking film overlying the protein layer, the material of the masking film being such as to be modified by radiant energy so as to be removable from the protein layer where irradiated. The method is flexible in the sense that it is possible to proceed via either a positive or a negative of the desired micropattern and to build a more extensive, or more complex, micropattern from an initial relatively simple micropattern.

52 Claims, 11 Drawing Figures

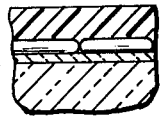

STEP 1.
  PROVIDE SUSTRATE AS IN FIG. 1.

STEP 2.
  IRRADIATE WITH AN ELECTRON BEAM A SPECIFIC AREA OF THE RESIST FILM ACCORDING TO DESIRED MICROPATTERN.

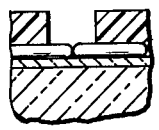

STEP 3.
  REMOVE IRRADIATED RESIST FILM, THUS EXPOSING PROTEIN MONOLAYER IN IRRADIATED AREAS.

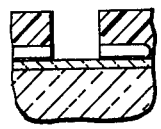

STEP 4.
  REMOVE EXPOSED PROTEIN MONOLAYER, EXPOSING SILICON DIOXIDE IN THE IRRADIATED AREA AND LEAVING PROTEIN MONOLAYER AND RESIST FILM AS A NEGATIVE MASK IN THE AREA NOT IRRADIATED.

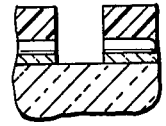

STEP 5.
  REMOVE EXPOSED SILICON DIOXIDE, THUS EXPOSING SILICON IN IRRADIATED AREA.

STEP 6.
  IRRADIATE OVERALL AND REMOVE REMAINING COMPOSITE RESIST, LEAVING SILICON DIOXIDE AS A NEGATIVE MASK.

STEP 7.
  INTRODUCE DOPANT INTO SILICON OF EXPOSED AREA, USING DIFFUSION FURNACE, ADDITIONAL SILICON DIOXIDE BEING BUILT UP BY THERMAL OXIDATION, INCLUDING A FILM OF SILICON DIOXIDE OVER DOPED AREA.

STEP 8.
  APPLY NEW COMPOSITE RESIST OVER ENTIRE SUBSTRATE AS IN FIG. 1

*FIG. 4*

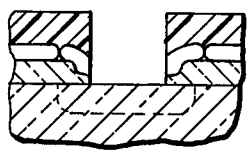

STEP 9.
  IRRADIATE PREDETERMINED AREA WITHIN DOPED AREA AND REMOVE COMPOSITE RESIST AND NEW SILICON DIOXIDE FROM IRRADIATED AREA.

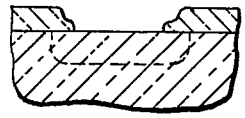

STEP 10.
  IRRADIATE OVERALL AND REMOVE REMAINING COMPOSITE RESIST.

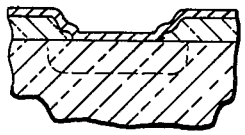

STEP 11.
  DEPOSITE CONDUCTIVE METAL OVER ENTIRE SUBSTRATE.

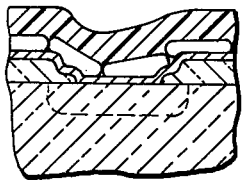

STEP 12.
  APPLY NEW COMPOSITE RESIST.

STEP 13.
  IRRADIATE IN AREA WHERE METAL IS NOT DESIRED.

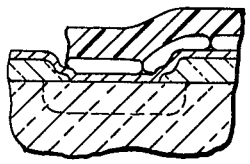

STEP 14.
  REMOVE IRRADIATED COMPOSITE RESIST, THUS EXPOSING UNDESIRED METAL, THE REMAINING COMPOSITE RESIST CONSTITUTING A POSITIVE MASK.

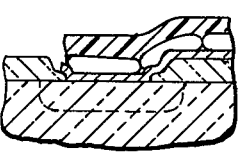

STEP 15.
  REMOVE UNDESIRED METAL BY CHEMICAL ETCHING.

STEP 16.
  IRRADIATE OVERALL AND THEN REMOVE REMAINING COMPOSITE RESIST TO OBTAIN ARTICLE OF FIG. 3

*FIG. 4A*

MICRODEVICE SUBSTRATE AND METHOD FOR MAKING MICROPATTERN DEVICES

BACKGROUND OF THE INVENTION

Rapidly expanding usage of electronic microcircuits has resulted in a rapid advance in the art of producing articles in the nature of a micropattern of a functional material supported on or in a substrate base of a dissimilar material. Recently developed procedures employ, e.g., as a substrate for the microdevice, a base of silicon covered by silicon dioxide, and an electron resist covering the silicon dioxide, the resist being selectively irradiated by an electron beam in accordance with the micropatterning step to be performed, the irradiated resist then being removed to expose selected areas of the silicon dioxide, the exposed areas then being treated, as by etching, if necessary, the functional material then being applied, and the resist then being removed in the area which has not been irradiated, bringing the substrate to a condition suitable for the next micropatterning step. Typical requirements include diffusion of dopants into the silicon base in one or more selected areas, and provision of a conductive metal on defined areas of the silicon dioxide, and such requirements are met by different procedures each requiring use of an electron resist on which a portion of the micropattern is written by electron beam irradiation. It is common to use as the electron resist a synthetic polymer which is partially depolymerized by electron beam irradiation, the partially depolymerized material being removable by dissolution in, e.g., the corresponding monomer.

Though such prior-art procedures have achieved marked success, they are limited to those objectives which can be accomplished by treatments controlled by the presence or absence of the resist on the base. Further, such procedures require relatively extensive electron beam irradiation to "write" the pattern desired, and writing time has become recognized as a primary limiting factor. Finally, while such methods are now commonly used to produce micropatterns of very small size, with, e.g., conductive path widths as small as 1000 A, further reduction in the dimensions of the micropattern is highly desirable.

OBJECTS OF THE INVENTION

It is a general object of the invention to provide an improved method for producing microdevices, in the nature of micropatterns supported on a substrate base, which will have not only the advantages of prior-art methods but also the advantage of increased flexibility with regard to the nature and size of the micropattern produced.

Another object is to provide an improved microdevice substrate for use in accordance with the method.

A further object is to devise a method of the type described which makes it possible to markedly reduce the writing time required to produce micropatterns.

Yet another object is to provide such a method whereby an element of a microcircuit, for example, in the nature of a conductive line can be produced without tracing the entire line with an electron beam.

A still further object is to provide for the production of micropatterns, employing an electron resist, without requiring the step of writing the complete micropattern.

SUMMARY OF THE INVENTION

Method embodiments of the invention employ a microdevice substrate, which can be characterized as having a composite resist, and which comprises a substrate base, typically silicon covered with silicon dioxide, a protein layer covering the base, and a thin film of an electron resist material covering the protein layer, the protein layer comprising at least a first layer which is secured to the base and which is a compressed monolayer of a denatured globular protein, and the electron resist material being removable from the protein layer once the electron resist material has been irradiated with an electron beam. In carrying out the method, an area of the electron resist film, predetermined by the micropattern desired, is irradiated with an electron beam and the irradiaed area then removed to expose the protein layer for further treatment. In a simple embodiment of the method, the area of the protein layer thus exposed is a positive of the desired micropattern and the further treatment comprises removal of the protein in the exposed area, and the next micropatterning step is carried out on the exposed area, with the remaining electron resist material and protein serving as a negative mask and being subsequently removed. In another embodiment, an area of the protein monolayer is exposed as a negative of the desired micropattern, and a second protein is linked to the protein of the monolayer, the entire surface of the substrate is then irradiated, the electron resist film and monolayer then removed from the base in all but the negative area, the next micropatterning step then carried out on the area of the base thus exposed with the second protein linked to the monolayer serving as a negative mask, and the protein and remaining electron resist film then removed from the negative area. In other embodiments, the protein of the monolayer is one the molecules of which each have a specific reactive site, the molecules of the protein of the monolayer are arranged in a predetermined spatial pattern, the resist or masking film is removed in areas which the predetermined with reference to the pattern of the protein molecules, and pattern building material, typically an enzyme or a metal-containing protein, is reactively attached to the exposed areas of the monolayer.

In order that the manner in which these and other objects are achieved according to the invention can be understood in detail, particularly advanageous embodiments of the invention will be described with reference to the accompanying drawings, which form part of the original disclosure hereof, and wherein.

Figure 6:
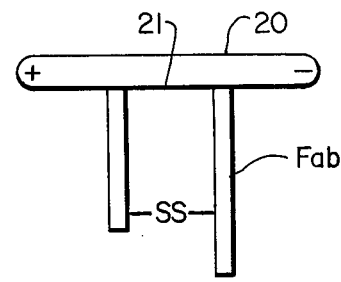
Figure 5:
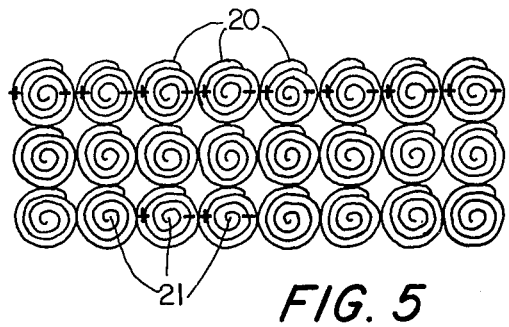
Figure 7:
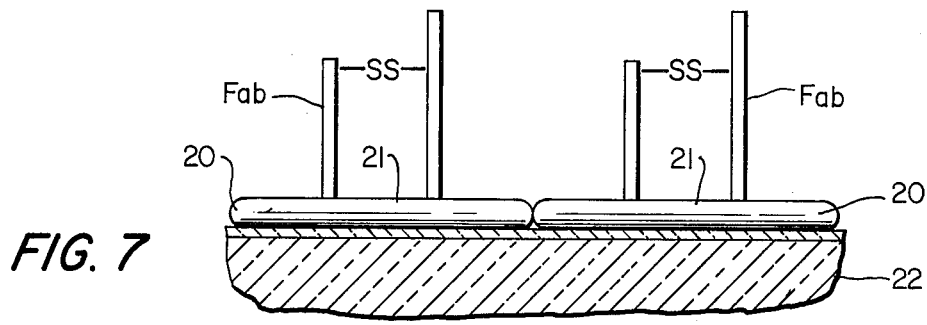
Figure 8:
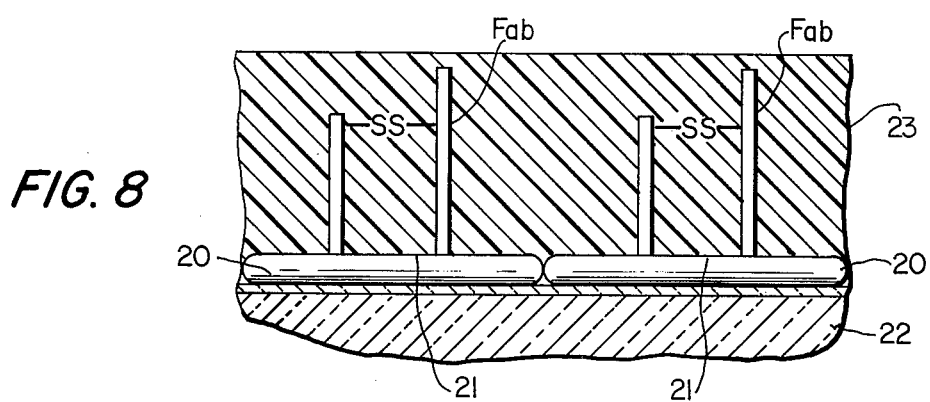
Figure 9:
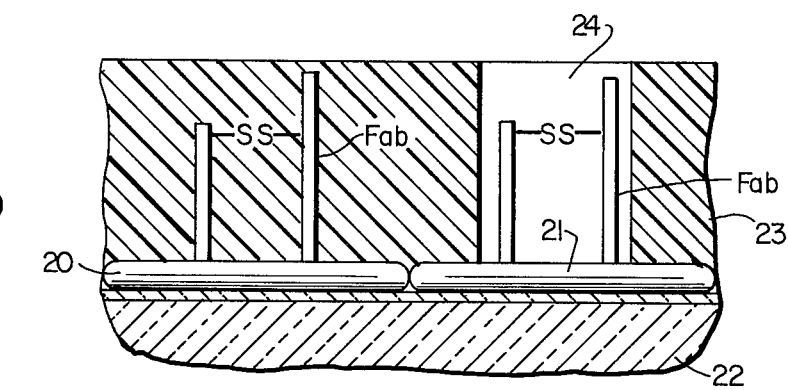
Figure 9A:
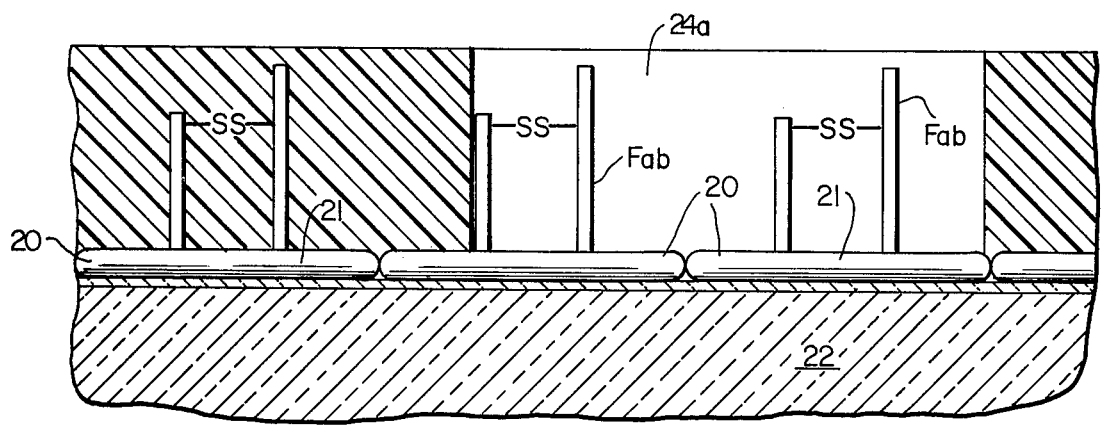

FIGS. 4 and 4A combine to provide a flow diagram illustrating one embodiment of the method;

FIG. 5 is a diagrammatic illustration of a stereospecific protein monolayer employed according to the invention;

FIG. 6 is a diagrammatic side elevational view of the manner in which a pattern-building molecule is attached to the monolayer of FIG. 5;

FIG. 7 is a diagrammatic view showing the manner in which the product of FIGS. 5 and 6 is attached to a substrate base;

FIG. 8 is a semi-diagramatic transverse cross-sectional view of a microsubstrate embodying the product of FIGS. 5-7; and FIGS. 9 and 9A are views similar to FIG. 8 but illustrating manners in which portions of the masking film of the microsubstrate can be selectively removed.

DETAILED DESCRIPTION OF SIMPLE MICRODEVICE SUBSTRATE

Simple microdevice substrates according to the invention comprise a substrate base, a protein layer comprising at least a compressed monolayer of a denatured globular protein overlying the surface of the substrate base and secured thereto, and a thin film of masking material covering the protein layer. The protein layer can be made up entirely of the protein monolayer, with the structure then consisting of the substrate base material 1, FIG. 1, a thin inorganic insulating film 2 on the surface of the base, the protein monolayer 3, and the masking film 4. Alternatively, the protein layer can be made up of a compressed monolayer 13, FIG. 2, of denatured globular protein and a second layer 13a of protein which can be adhered to the monolayer in such quantity as to provide a layer on the order of, e.g., 1000 Angstrom units in thickness. In this embodiment, the masking film 14 is applied to the surface of protein layer 13a. Protein layer 13a can be of a single protein in undenatured form, or can be made up of a plurality of protein layers, or can be a single additional protein monolayer. While, for simplicity of illustration, the masking films 4 and 14 have been shown as discrete films overlying the protein layer, films 4 and 14 advantageously include material which impregnates the protein layer and is present in all of the intramolecular and intermolecular interstices of the protein layer.

The substrate base 1 can be of any solid material which is dissimilar with respect to the functional material or materials of which the micropattern is to be formed and has adequate strength and other physical properties to support the micropattern under the conditions of use. In the case of electronic microcircuits, the substrate base can be silicon, typically in the form of a wafer with a diameter of 1-2 in., the silicon being covered with an insulating layer 2 of silicon dioxide.

Monolayer 3 is a layer of denatured protein which is one molecule thick, the protein being a globular protein having a maximum molecular dimension not greater than 500 Angstrom units and a ratio of greatest molecular dimension to smallest molecular dimension of at least 2:1. The molecules of the denatured protein of the monolayer are further characterized by having a hydrophilic side and a hydrophobic side facing in generally opposite directions and separated by a distance which is small relative to the maximum dimension of the molecule. Such monolayers are prepared conventionally by flowing a molecular solution of the protein onto the surface of water in a Langmuir trough and laterally compressing the film under the influence of a glass bar moved laterally across the water surface until a surface tension of 0.1-0.3 dyne/cm. is obtained as measured by, e.g., a Wilhelmy balance. The usual procedure is described by Kleinschmidt, A.K. and Zahn, R.K., *Ztschr. Naturforschg.* 14b, 159, commencing at page 770. Typically, the protein can be dissolved in an aqueous ammonium acetate solution at dilutions on the order of $10^{-4}$ gram of the protein per ml. While the usual practice is to lift the protein monolayer from the water-air interface with a grid, it is advantageous to lift the monolayer directly with the substrate base, so that the compressed monolayer is recovered and applied to the base in the same step, the monolayer then being dehydrated with ethanol. While many globular proteins having the aforementioned characeristics can be employed, specific examples of suitable proteins include cytochrome c, chymotrypsin, bovine serum albumin, and trypsin.

Masking or resist film 4 can be of any masking material which responds to radiant energy in such fashion as to be significantly more easily removable after irradiation, so that irradiation of a predetermined area of the masking film renders the film selectively removable in the irradiated area. Particularly advantageous are those materials which have a marked response to sub-atomic particle radiation, including electron beam, proton beam and neutron beam radiation. The masking material can also be one which has a specific response to electromagnetic radiation, including X-ray, microwave, infra red, ultra violet and visible radiation. The masking material can also be one which is removable by an ion beam, typically by a focussed ion beam. The term "radiant energy", as used herein includes the energy of (a) sub-atomic particle radiation, (b) electromagnetic radiation and (c) ion beam radiation. It is particularly advantageous to employ as film 4 an in situ polymerized film of a synthetic polymeric material which is partially depolymerized by electron beam irradiation. Of the synthetic polymeric materials, those derived from the acrylic esters, especially methyl acrylate and methyl methacrylate, are particularly useful, those polymers being soluble in the respective monomers so that selective removal of the masking film from irradiated areas is easily achieved by dissolution in the monomer. Advantageously, film 4 is established by flowing methyl methacrylate, containing both a free-radical initiator type polymerization catalyst and a cross-linking agent, onto the protein monolayer and accomplishing polymerization to the solid state in situ by time or time and moderate heat. The in situ polymerized masking film has a maximum thickness (measured from the surface of the protein monolayer) of from about 10 Angstrom units to about 1000 Angstrom units, best results being achieved when the thickness does not exceed 30 Angstrom units. Polymerized in situ, masking film 4 not only completely covers the protein monolayer but also fills the molecular interstices of the monolayer.

Figure 1:
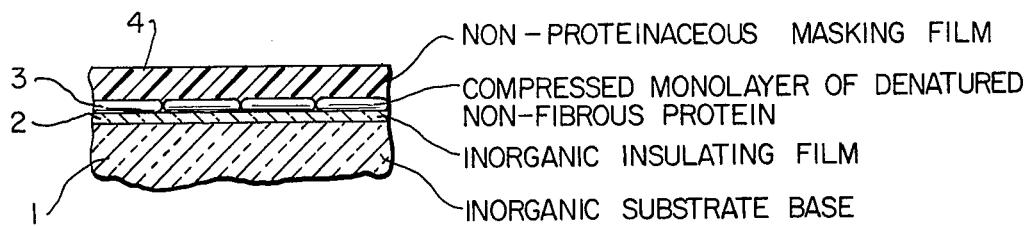
FIGS. 1 and 2 are semi-diagrammatic transverse cross-sectional views of microdevice substrates according to the invention.

The following example is illustrative of preparation of microdevice substrates according to FIG. 1:

EXAMPLE 1

A solution of cytochrome c is prepared by introducing the protein into a 1-molar aqueous solution of ammonium acetate to provide $10^{-4}$ gram of protein per ml. in molecular solution. The protein solution is flowed onto the surface of a 0.1 molar solution of ammonium acetate in a Langmuir trough at the rate of about 0.2 ml. per minute, using a pipette, until 2.5 ml. of the protein solution has been flowed on, the film then being allowed to spread freely on the surface for 10 minutes under covered, clean, quiescent conditions. The resulting protein monolayer is then compressed to 0.1 dynes/cm., using a square glass rod. At this point, it must be recognized that the protein of the monolayer is denatured as a result of the surface tension at the air-water interface and that each molecule of the protein of the monolayer is oriented with its hydrophilic side toward the water and its hydrophobic side toward the air. A silicon wafer covered by a film of silicon dixode and of smaller plan extent than the compressed protein monolayer is now lowered, silicon dioxide surface down, slowly into engagement with the monolayer. The monolayer adheres to the silicon dioxide surface and, when the wafer is withdrawn, the monolayer covers and is adhered to the silicon dioxide film on the wafer, with the predominently hydrophilic side of each protein molecule directed away from the wafer. The wafer is then immersed in an ethanol solution and ethanol added in sequential steps of a graded series, to dehydrate the protein monolayer.

Liquid methyl methacrylate is catalyzed by addition of benzoyl peroxide and divinyl benzene, as a cross-linking agent, in amounts equal to 1% and 5%, respectively, of the weight of the monomer. The methyl methacrylate is then flowed over the protein monolayer on the silicon afer and the substrate then allowed to stand, protein layer up, at room temperature for 10 hours, yielding a finished substrate having the configuration shown in FIG. 1, with the cross-linked polymethacrylate constituting film 4. In this substrate, the monolayer 3 of cytochrome c will have a thickness of about 12-14 Angstrom units, and the polymethyl methacrylate film 4 can have a thickness, in addition to that of the monolayer, on the order of 10-1000 Angstrom units or thicker.

In native form, globulins such as cytochome c can be viewed as made up of helically arranged amino acid molecules, usually referred to as residues, interrupted by changes of direction at the junctures between amino acid molecules, by cross-linking at disulfide sites, and by presence of metal ions linked internally in the folded structure, the globulin macromolecule being a relatively compact structure. The cytochome c of monolayer 3, however, has been denatured by the surface tension at the air-water interface, during formation of the monolayer, and no longer possesses the compact macromolecular form. Denaturing can be considered as a partial uncoiling of the helices of the macromolecule to such an extent that the denatured macromolecules is in the form of a relatively flat structure with hydrophilic sites exposed at one side and hydrophobic sites exposed at the other. With the silicon wafer lowered into engagement with the monolayer, the hydrophobic sites of the protein are exposed to the silicon dioxide surface of the wafer and the protein monolayer is secured to the silicon dioxide by surface adhesion.

Denaturation of the cytochrome c of the monolayer has the effect of making the protein molecule less compact, so that the denatued macromolecule is characterized by intramolecular interstices of considerable size and number. When the liquid methyl methacrylate is applied to establish film 4, the liquid enters and fills the intramolecular interstices so that the polymethyl methacrylate of the cured electron resist film 4 is integral with like polymeric material within the denatured protein monolayer.

Figure 2:
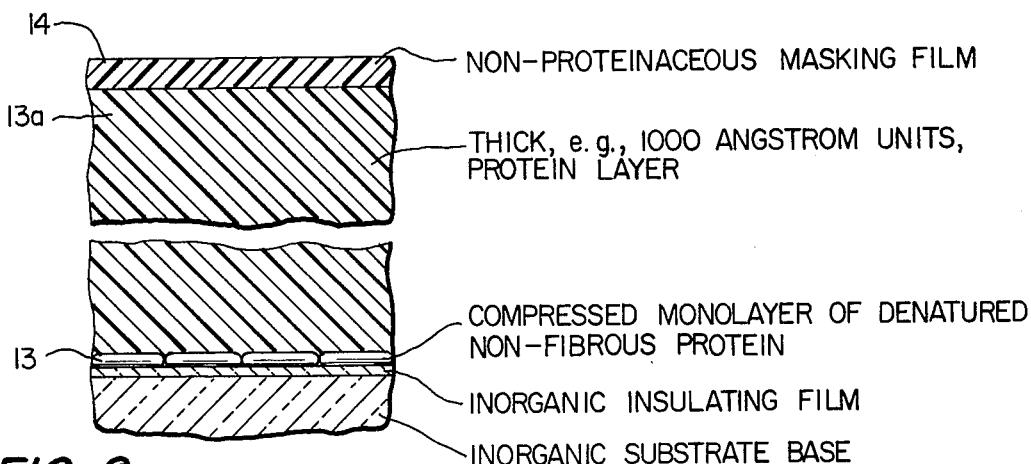

Microdevice substrates according to FIG. 2 can be made in a fashion similar to that of Example 1, save that a solutin of the protein for layer 13a is flowed onto the exposed surface of the monolayer 13, glutaraldehyde is then added to the protein solution as a cross-linking agent, and the device allowed to stand for a few minutes, yielding layer 13a as a solid layer of glutaraldehyde-protein complex secured to monolayer 13 by cross-linking between amino groups of the two proteins. The electron resist film 14 is then applied as explained in Example 1.

Figure 3:
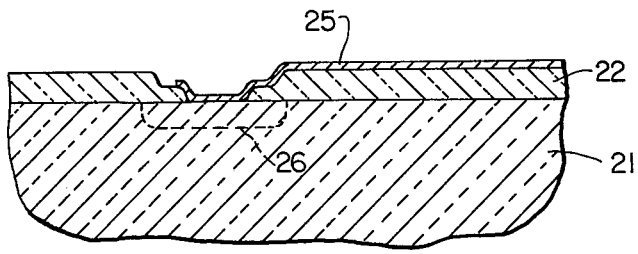
FIG. 3 is a semi-diagrammatic transverse cross-sectional view of a finished micropattern produced according to the invention.

DETAILED DESCRIPTION OF MICRODEVICE OF FIG. 3 AND ITS PRODUCTION ACCORDING TO METHOD EMBODIMENT OF FIGS. 4 AND 4A

In this embodiment of the invention, the finished article comprises a micropattern 25, FIG. 3, of conductive metal supported by the substrate base, the surface of those positions of the substrate base not overlain by micropattern 25 being exposed. For simplicity of explanation, micropattern 25 is considered to be a metal element having a width of approximately 100 Angstom units and extending as a straight line from the doped, semiconductor area 26 of silicon wafer 21 across the silicon dioxide film 22, the straight line constituting a conductive lead to the semiconductor area. As illustrated by the flow diagram of FIGS. 4 and 4A, the method is commenced by preparing a substrate base unit according to Example 1, consisting of a silicon wafer carrying a silicon dioxide film, a compressed monolayer of denatured cytochrome c overlying the silicon dioxide film, and an electron resist film of polymethyl methacrylate overlying the cytochrome c monolayer. As the second step, the substrate base is irradiated with a focussed electron beam, as by using a computer controlled scanning electron microscope, over the area 26 to be doped to form the active semiconductor area. Such irradiation can be at a dosage level of from $10^{-7}$ to $10^{-5}$ coulomb per square centimeter at 10,000 EV. The substrate base is then washed with methyl methacrylate monomer, as the third step, to dissolve all of the polymethyl layer which has been irradiated, thus exposing the protein monolayer in the area 26. For the fourth step, the exposed protein monolayer is then removed, either by dissolving the protein with an aqueous solution having a pH equal to the isoelectric point of the cytochrome c or by digesting the protein with an aqueous solution of a proteolytic enzyme, to expose the silicon dioxide film in the area of the wafer which is to be doped. In the fifth step, the exposed silicon dioxide is removed, as by etching with hydroflouric acid. The sixth step of the method is carried out by irradiating the substrate overall, as with X-ray irradiation of electron beam irradiation, then removing the remaining polymethyl methacrylate as in step 3, and then removing the remaining protein monolayer, as in step 4, so that the substrate now presents the exposed predetermined area of the silicon wafer, with the remainder of the wafer covered by silicon dioxide as a negative mask. In step 7, the dopant desired for the active semiconductor area 26 is introduced in conventional fashion with a diffusion furnace and, if plural dopants are involved, the doping step is conventionally repeated. Using a diffusion furnace, additional silicon dioxide film 22 is built up, so that the overall silicon dioxide film 22 is thickened and a thin film of silicon dioxide also now extends over the doped area 26.

The eighth step of the method requires reestablishment of the composite resist according to Example 1, including the compressed denatured cytochrome c monolayer and the overlying film of cross-linked polymethyl methacrylate as the electron resist. In step 9, a predetermined area smaller than the doped area and located therewithin is irradiated with a focussed electron beam, and the irradiated composite resist removed as in steps 3 and 4, the area of silicon dioxide thus exposed then being removed as in step 5. The entire substrate is then irradiated for step 10, as with X-ray radiation or electron beam radiation, and the composite resist then removed overall as in step 6, so that the surface of the substrate now appears as a predetermined exposed area of the silicon wafer with the remainder covered by silicon dioxide as a negative mask. Step 11 consists of vapor depositing aluminum, by conventional techniques, over the entire substrate. The method is then continued in step 12 by applying a new composite resist, again including the compressed denatured cytochrome c monolayer and polymethyl methacrylate resist film, in accordance with Example 1. Step 13 then consists of irradiating the entire substrate except for the area to be occupied by aluminum in the final product, this irradiation being carried out by use of a focussed electron beam irradiation in known fashion. In step 14, the areas of the composite resist thus irradiated are removed, as in steps 3 and 4, leaving composite resist as a positive mask overlying the area to be occupied by aluminum in the finished article. The undesired metal is then removed by chemical etching, as step 15, and the remaining composite resist removed as in steps 3 and 4 to yield the product seen in FIG. 3.

Though the case of a straight line has been described for simplicity, it will be understood that micropatterns of usual complexity can be produced in the same fashion. And, while a simple metal deposition in the positive area has been described, it will be understood that, using conventional procedures, other applications of a functional material or materials can replace simple metal deposition. Such other applications include e.g., deposition of metal oxide films or alloy films as resistive circuit elements, the introduction of dopants, and the application of dielectric materials.

The article illustrated in FIG. 1 can be considered as a microsubstrate comprising a base substrate supporting a composite electron resist, the composite resist being made up of the polymeric masking film 4 and the protein monolayer 3, and it is significant that the two components of the composite are removable by different procedures each specific to a different one of the two components. The method described with reference to FIGS. 4 and 4A demonstrates that such a microsubstrate can be used to produce a micropattern in a manner generally similar to currently employed single electron resist procedures. An advantage of the article and method embodiments thus far described is an increase in electron beam writing speed, arising from the fact that the electron resist film 4, being part of a composite resist, is substantially thinner than the usual polymeric resists, as well as an improvement in edge definition. In this regard, it is to be noted that the polymethyl methacrylate of electron resist layer 4, FIG. 1, also extends within the interstices of the protein of monolayer. With an electron beam is focussed onto the substrate, the electron dosage required to render the corresponding area of film 4 easily removable depends upon the thickness of that layer. But the polymethyl methacrylate present in the interstices of the protein monolayer is disperse, as the interstices are disperse, and a much smaller electron dosage is expended within the monolayer, yet the irradiated polymethyl methacrylate in the interstices of the protein is readily removable by dissolution. Removal of the protein itself in the irradiated area does not depend upon irradiation, and a smaller dosage is therefore permissible than if, for example, the total thickness of films 3 and 4 were made up of solid polymethyl methacrylate. Further, presence of the polymethyl methacrylate in the interstices of the protein monolayer, and the fact that the aqueous liquid used to dissolve the protein after removal of the polymethyl methacrylate does not dissolve polymethyl methacrylate, tend strongly to minimize undercutting, and loss of edge definition, during dissolution of the exposed protein.

The microdevice substrate of FIG. 2 is employed when it is desirable that the invention can be compatible with conventional techniques and procedures. Using the additional protein layer 13a, the composite resist comprising the protein monolayer 13, the additional protein layer, and the masking film 14 can have a total thickness which approximates that of the thinner prior-art resists. Yet the embodiment of FIG. 2 provides distinct improvements in writing speed and edge definition in the manner earlier described with reference to FIGS. 1 and 3-4A.

EMBODIMENTS BASED ON STEREOCHEMICALLY SPECIFIC SUBSTRATES

Another advantage of the use according to the invention of substrates including a compressed protein monolayer lies in the fact that the substrate can be made stereochemically specific, with molecular components of the substrate arranged in a spatial configuration which is predetermined precisely and upon which the desired micropattern can be based.

Employing a compressed monolayer of denatured cytochrome c as the protein monolayer, the fact that the cytochrome c molecules are spiral-like in plan, relatively thin or flattened in edge elevation, and have diametrically opposite positive and negative sites makes it possible to align the cytochrome c molucules into the plan array shown diagramatically in FIG. 5, with the molecules 20 aligned in rows. This can be accomplished by subjecting the monolayer, while it is being formed, to the action of a strong, high voltage, low amperage, direct current electric field. Essentially identical and of the same size, the denatured cytochrome c molecules 20 each have an antigenic site, indicated for simplicity at 21 in the central area of the molecule. In the array established by the influence of the electric field, the location of each antigenic site 21 is known with some precision, so that it is practical to attach another component of the substrate at points determined by the location of the antigenic sites.

Typically, the component to be so attached can be the antigen-binding fraction of gamma globulin, recovered by electrophoresis or column chromatography from an ionic aqueous solution of gamma globulin which has been treated with the enzyme papain to cleave the gamma globulin molecules into the $F_{ab}$ (antigen-binding) and $F_c$ (cyrstalline) fragments. To accomplish attachment of one $F_{ab}$ fragment of gamma globulin to each antigenic site 21 presented by the cytochrome c monolayer, an aqueous medium containing the $F_{ab}$ fraction recovered from the papain treatment is simply flowed into the aqueous liquid upon which the cytochrome c monolayer has been formed. In this connection, it will be understood that the antigenic sites 21 appear on the hydrophilic sides of the cytochrome c molecules and are therefore immediately available for reaction with the $F_{ab}$ fragments in the aqueous liquid, and the reaction proceeds immediately upon introduction of the $F_{ab}$ fragments, with attachment of the $F_{ab}$ fragments occurring as indicated diagramatically in FIG. 6. At this stage, the cytochrome c monolayer, with an $F_{ab}$ fragment of gamma globulin attached at each antigenic site 21, is secured to a silicon wafer or other substrate base 22 by lowering the base 22 downwardly onto the monolayer and lifting the monolayer from the liquid, the hydrophobic side of the monolayer adhering to the base. Inverted, the resulting assembly is as shown in FIG. 7.

The microdevice substrate is then completed by applying a non-proteinaceous resist film 23, FIG. 8, of a thickness to completely cover the $F_{ab}$ fractions. Film 23 is of a resist material with a marked response to electron irradiation. Typically, the film is of cross-linked polymethyl methacrylate, produced as hereinbefore described.

Since the cytochrome c molecules 20 are arranged in a predetermined grid-like array, and the antigenic sites 21 occupy positions of known location on the molecules, the $F_{ab}$ fragments are disposed in a grid-like array predetermined by the cytochrome c monolayer. Accordingly, reactive ends of the $F_{ab}$ fragments can be selectively exposed by subjecting the resist film 23 to irradiation by a focussed electron beam only in the immediate locations of one, or a predetermined group, of the $F_{ab}$ fragments and then removing the irradiated resist material, as by dissolving in methyl methacrylate monomer when the film is of polymethyl methacrylate. This step yields the structure shown in FIG. 9, if the irradiated areas 24 are registered precisely with individual $F_{ab}$ fragments, or the structure shown in FIG. 9A, when the irradiated areas 24a are registered with a predetermined group of the $F_{ab}$ fragments.

The now exposed ends of the $F_{ab}$ fragments constitute antigenic sites, making it possible to attach to the substrate at each of those sites any additional component capable of reacting with an antigenic site. Suitable additional components include the proteins and peptides, either unaltered or with other elements, compounds or complexes added thereto by prereaction.

A typical example of a component that can be added directly at the antigenic sites presented at the exposed ends of the $F_{ab}$ fragments is ferritin, and the addition can be accomplished from an aqueous solution containing m-xylylene diisocyanate or toluene 2,4-diisocyanate as a cross-linking agent, following the procedures of Singer, S. J. and Schick, A. F. (1961), *J. biophys. biochem Cytol.*, Vol. 9, page 519. Particularly useful components to be added at the exposed antigenic sites of the $F_{ab}$ fragments are enzymes, especially peroxidase and phosphatase, which provide a convenient route to deposition of metal on the substrate in the micropattern specifically defined by the exposed antigenic sites. Thus, for example, phosphatase can be reacted with an organic phosphate, such as creatinine phosphate or adenosine triphosphate, to yield creatinine plus the phosphate radical or adenosine diphosphate plus the phosphate radical, the liberated phosphate then being reacted with, e.g., lead nitrate to yield insoluble lead phosphate. The lead phosphate can then be reduced by heat to yield metallic lead which, as the protein is destroyed thermally, deposits on the substrate at the site occupied by the phosphatase. Since the spaces between the exposed antigenic sites of the $F_{ab}$ fragments are of the order determined by the molecular dimensions of the cytochrome c, a group of the exposed antigenic sites will predetermine a continuous precipitate of lead in the procedure just described, assuming that a corresponding amount of the organic phosphate is employed. Thus, if a plurality of adjacent rows of the exposed antigenic sites are treated as just described, the resulting lead deposit can constitute a straight conductor portion of finite width and length determined by the rows so treated.

In order to selectively expose the reactive sites of the stereospecific monolayer, the repetitive molecular pattern can be detected by monitoring the back-scattered image of the molecules, using an electron beam in the scanning electron microscope mode. The beam spot size can be selected from a range from smaller than the protein molecule of the monolayer, e.g., one fourth the maximum dimension of the molecule, to a diameter large enough to expose a significant number of the molecules. The beam intensity, diameter and position can then be predetermined to optimally expose the desired number and locations of sites for the pattern being written.

Instead of employing the sequence of steps just described in order to arrive at a micropattern defined by, e.g., phosphatase, such a pattern can be obtained by attaching an enzyme labelled macromolecule to the antigenic sites presented by the protein monolayer after the monolayer has been subjected to the electric field. Thus, a compressed monolayer of denatured cytochrome c can be established on the surface of a body of aqueous liquid as described in Example 1, and the molecules of cytochrome c brought into a grid-like plan array by subjecting the monolayer, during formation, to the action of a strong, high voltage, low amperage, direct current electric field. A dilute, e.g., 1% by weight, solution of anticytochrome c phosphatase labelled antibody is then introduced into the liquid below the monolayer, so that one molecule of the antibody is attached to each antigenic site presented by the cytochrome c monolayer. The monolayer is then lifted with a silicon wafer as described in Example 1 and the exposed surface of the monolayer then covered with a cross-linked polymethyl methacrylate masking film by in situ polymerization as described in Example 1. The resulting product is a microsubstrate presenting phosphatase molecules in the grid-like plan array determined by the cytochrome c monolayer, the phosphatase being covered by polymethyl methacrylate. The microsubstrate can thus be characterized as comprising a supported layer of protein in which the macromolecules have a known, stereospecific, spatial disposition, and also macromolecules of a pattern-building protein, the phosphatase labelled antibody, arranged in the pattern determined by the supported layer. Further patterning steps can now be carried out with the microsubstrate, again relating those steps to the grid-like plan array of the cytochrome c monolayer by monitoring the back-scattered image with the scanning electron microscope.

For example, the phosphatase can be deactivated in a selected negative area or areas by subjecting the area or areas of the microsubstrate to irradiation with a focussed electron beam at a heavy dosage level, e.g., $10^{-5}$ coulombs/cm. sq. at 10KV. In addition to deactivation of the enzyme, such heavy dosage electron beam writing also partially depolymerizes the polymethyl methacrylate in the selected negative area or areas, rendering the same selectively removable by dissolution in the monomer. Lead can then be introduced at the phosphatase sites, as by reacting the phosphatase with creatinine phosphate to yield phosphate ions then reacting the liberated phosphate with lead nitrate, and thermally reducing the resulting lead phosphate to yield metallic lead.

What is claimed is:

1. A microsubstrate for the production of micropatterns, comprising
   a substrate base;
   a protein layer overlying said substrate base and comprising a compresseed monolayer of denatured non-fibrous protein adhered to said base,
      said denatured protein having a maximum molecular dimension not greater than 500 Angstrom units and a ratio of greatest molecular dimension to smallest molecular dimension of at least 2:1;
      the molecules of said denatured protein having a hydrophilic side and a hydrophobic side facing in generally opposite directions and separated by a dimension which is small relative to the maximum dimension of the molecule; and
   a film of masking material overlying and adhered to said protein layer.

2. A microsubstrate according to claim 1, wherein the protein of said monolayer is cytochrome c.

3. A microsubstrate according to claim 1, wherein the protein of said monolayer is chymotrypsin.

4. A microsubstrate according to claim 1, wherein the protein of said monolayer is bovine serum albumin.

5. A microsubstrate according to claim 1, wherein the protein of said monolayer is trypsin.

6. A microsubstrate according to claim 1, wherein said substrate base is of silicon and said surface thereof is of silicon dioxide.

7. A microsubstrate according to claim 1, wherein said protein layer comprises an additional layer of protein overlying said monolayer.

8. A microsubstrate according to claim 7, wherein said film of masking material comprises a portion which overlies said additional layer of protein and a portion which occupies the intramolecular and intermolecular interstices of said protein layer.

9. A microsubstrate according to claim 7, wherein said additional layer of protein is significantly thicker than said monolayer.

10. A microsubstrate according to claim 1, wherein said film of masking material is of polymeric material having the property of being significantly depolymerized by irradiation.

11. A microsubstrate according to claim 10, wherein said masking film is an in situ polymerized film and includes both a portion overlying said protein layer and a portion occupying the molecular interstices of said protein layer.

12. A microsubstrate according to claim 11, wherein said protein layer consists of said monolayer.

13. A microsubstrate according to claim 11, wherein said film of masking material is adhered directly to said monolayer.

14. A microsubstrate according to claim 11, wherein the portion of said film of masking material which overlies said monolayer has a maximum thickness of from about 10 to about 1000 Angstrom units.

15. A microsubstrate according to claim 11, wherein the portion of said masking film overlying said protein layer has a thickness of from about 10 to about 1000 Angstrom units.

16. A microsubstrate according to claim 15, wherein said thickness does not significantly exceed 30 Angstrom units.

17. A microsubstrate according to claim 1, wherein the protein molecules of said monolayer each have a specific reactive site and are arranged in a predetermined stereospecific pattern.

18. A microsubstrate according to claim 17, wherein said protein layer further comprises molecules of an additional material, other than the protein of said monolayer, each attached to said reactive site of a different one of the molecules of said monolayer.

19. A microsubstrate according to claim 18, wherein said additional material is a material selected from the group consisting of complexes of protein with an elemental metal and complexes of protein with an inorganic compound of a metal.

20. A microsubstrate according to claim 18, wherein said additional material is an enzyme.

21. A microsubstrate according to claim 18, wherein said stereospecific pattern is a grid.

22. A microsubstrate according to claim 18, wherein said additional material is selected from the group consisting of proteins and peptides.

23. A microsubstrate according to claim 22, wherein said additional material is a metal-containing protein.

24. A microsubstrate according to claim 23, wherein said metal-containing protein is ferritin.

25. In the fabrication of articles exhibiting a micropattern of a particular material carried by a surface of a support, the method comprising
   establishing on the support a first layer comprising a compressed monolayer of denatured non-fibrous protein in which the protein molecules each have a specific reactive site, with the protein molecules of the monolayer being spatially arranged in a predetermined pattern and said specific sites therefore occupying predetermined locations with reference to the pattern of said protein molecules;
   establishing over said first layer a film of masking material;
   selectively removing said masking film in areas predetermined with reference to the pattern of said protein molecules; and
   reactively attaching a pattern-building material to the resulting exposed portions of said first layer to establish on the support the desired micropattern in configuration and location dependent upon the spatial arrangement of the protein molecules of said monolayer.

26. The method according to claim 25, wherein said pattern-building material comprises an enzyme.

27. The method according to claim 25, wherein said pattern-building material comprises a material selected from the group consisting of complexes of protein with an elemental metal and complexes of protein with an inorganic compound of a metal.

28. The method according to claim 25, wherein said pattern-building material comprises at least one metal-containing protein.

29. The method according to claim 28, wherein said metal-containing protein is ferritin.

30. The method for producing the conductive micropattern of an electronic microcircuit, comprising
   establishing at the interface between two fluids a compressed monolayer of denatured non-fibrous protein,
      the protein of said monolayer having a maximum molecular dimension not greater tha 500 Anstrom units and a ratio of greatest molecular dimension to smallest molecular dimension of at least 2:1;
      the molecules of the protein having a hydrophilic site spaced from a hydrophobic site by a distance which is significant relative to the maximum dimension of the molecule;

applying said mololayer to a support formed of an electrical insulating material;

establishing on said monolayer a film of in situ polymerized polymeric masking material having the property of being significantly depolymerized by irradiation, said polymeric material covering said monolayer and also occupying the molecular interstices of said monolayer;

directing radiant energy on said film in areas predetermined by the micropattern desired and thereby significantly depolymerizing the polymeric material in said areas;

removing the polymeric material so depolymerized and thereby exposing said monolayer only in said areas;

and further treating said areas to deposit conductive metal therein.

31. In the fabrication of articles exhibiting a micropattern carried by a surface of a support, the method comprising establishing on the surface of the support a compressed monolayer of denatured nonfibrous protein, said denatured protein having a maximum molecular dimension not greater than 500 Angstrom units and a ratio of greatest molecular dimension to smallest molecular dimension of at least 2:1, the molecules of said denatured protein having a hydrophilic side and a hydrophobic side facing in generally opposite directions and separated by a dimension which is small relative to the maximum dimension of the molecule;

establishing a film of masking material which overlies said compressed monolayer and is characterized by being so modified by radiant energy as to be removable;

directing radiant energy on said film in an area predetermined by the micropattern desired; and removing said film from only said predetermined area to expose said monolayer for further treatment.

32. The method according to claim 31 wherein
the protein of said monolayer is characterized in that each molecule of the protein has a specific reactive site, the method further comprising treating said monolayer, before contact with the support, to arrange the protein molecules of the monolayer in a predetermined pattern to thus predetermine the arrangement of said reactive sites; and treating said monolayer with an additional material to cause said additional material to react with said protein and thereby attach molecules of said additional material each to a different molecule of the protein monolayer;

said film of masking material being established to cover not only said monolayer but also said molecules of said additional material attached to said monolayer;

said step of directing radiant energy being carried out by directing the radiant energy on said film only in a plurality of predetermined localized areas each occupied by at least one of said attached molecules of additional material, whereby said step of removing said film results in exposure of only the ones of said attached molecules of additional material which occupy said predetermined localized areas.

33. The method according to claim 32, wherein
said step of establishing said protein layer on the support comprises forming said monolayer at the air-liquid interface of a body of liquid, subjecting said monolayer to the action of an electric field to arrange the molecules of the monolayer in said predetermined pattern, introducing said additional material into said body of liquid and thereby causing said molecules of said additional material to attach at said reactive sites on the surface of said monolayer which faces the body of liquid, and engaging the support with the surface of said monolayer which faces away from the body of liquid to attach the monolayer to the support.

34. The method according to claim 32, further comprising flowing onto the areas from which said film has been removed a liquid solution of a component capable of reacting with said attached molecules of additional material.

35. The method according to claim 34, wherein said attached molecules of additional meterial are of an antigen-binding protein.

36. The method according to claim 35, wherein said component capable of reacting with said attached molecules of additional material is selected from the group consisting of proteins and peptides.

37. The method according to claim 36, wherein said component capable of reacting with said attached molecules of additional material is a metal-containing protein.

38. The method according to claim 37, wherein said metal-containing protein is ferritin.

39. The method according to claim 31, wherein the article to be fabricated is one in which the micropattern is of a particular material different from the material of the support.

40. The method according to claim 39, further comprising removing said protein layer from only said exposed predetermined area; and applying said particular material to the area of the support thus exposed.

41. The method according to claim 40, further comprising directing radiant energy on the remaining portion of said film; and removing said film and said monolayer from said remaining portion.

42. The method according to claim 40, wherein said protein is denatured globular protein; and said masking film is an in situ polymerized film of polymeric material which has the property of being significantly depolymerized by irradiation.

43. The method according to claim 42, wherein said masking film includes polymeric material occupying the molecular interstices of said monolayer.

44. The method according to claim 39, wherein said monolayer is one established on a body of liquid at the air-liquid interface.

45. The method according to claim 44, wherein the support is of an inorganic electrical insulating material;
said monolayer is established at the air-liquid interface of a body of aqueous liquid; and said monolayer is established on the support by lowering the support into physical contact with the compressed monolayer while the monolayer is at the air-liquid interface.

46. The method according to claim 44, wherein the protein of said monolayer is cytochrome c.

47. The method according to claim 44, wherein the protein of said monolayer is chymotrypsin.

48. The method according to claim 44, wherein the protein of said monolayer is bovine serum albumin.

49. The method according to claim 44, wherein the protein of said monolayer is trypsin.

50. The method according to claim 44, wherein said masking film is an in situ polymerized film of polymeric material and includes both a portion overlying said monolayer and a portion occupying the molecular interstices of said monolayer.

51. The method according to claim 50, wherein the portion of said masking film overlying said monolayer has a maximum thickness of from about 10 to about 1000 Angstrom units.

52. The method according to claim 51, wherein said thickness does not significantly exceed 30 Angstrom units.

* * * * *